US008390713B2

(12) United States Patent
Kuroda et al.

(10) Patent No.: US 8,390,713 B2
(45) Date of Patent: Mar. 5, 2013

(54) PHOTOELECTRIC CONVERSION DEVICE AND IMAGE-PICKUP APPARATUS

(75) Inventors: Yukihiro Kuroda, Ebina (JP); Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 51 days.

(21) Appl. No.: 13/028,334

(22) Filed: Feb. 16, 2011

(65) Prior Publication Data

US 2011/0134296 A1    Jun. 9, 2011

Related U.S. Application Data

(63) Continuation of application No. 12/050,326, filed on Mar. 18, 2008, now Pat. No. 7,911,521.

(30) Foreign Application Priority Data

Apr. 16, 2007 (JP) ................................. 2007-107625

(51) Int. Cl.
H04N 3/14 (2006.01)
H04N 5/335 (2011.01)
H01L 31/062 (2012.01)
H01L 31/113 (2006.01)

(52) U.S. Cl. ......... 348/301; 348/308; 257/292; 257/294

(58) Field of Classification Search .................. 348/275, 348/281, 301–302, 308; 257/291–292, 294
See application file for complete search history.

(56) References Cited

U.S. PATENT DOCUMENTS

| 6,731,337 | B2 | 5/2004 | Watanabe ...................... 348/308 |
| 7,064,362 | B2 | 6/2006 | Roy .............................. 257/225 |
| 7,710,477 | B2 | 5/2010 | Nam et al. .................... 348/275 |
| 7,911,521 | B2 * | 3/2011 | Kuroda et al. ................ 348/301 |
| 2006/0043393 | A1 | 3/2006 | Okita et al. ..................... 257/93 |
| 2006/0044434 | A1 | 3/2006 | Okita et al. ................... 348/294 |
| 2006/0061674 | A1 | 3/2006 | Iida et al. ..................... 348/308 |
| 2006/0073732 | A1 | 4/2006 | Vilarchao et al. ............. 439/576 |
| 2006/0208285 | A1 | 9/2006 | Inoue et al. ................... 257/239 |
| 2007/0058062 | A1 | 3/2007 | Ohta ............................ 348/308 |
| 2007/0069248 | A1 | 3/2007 | Ohta ............................ 257/239 |
| 2008/0029787 | A1 | 2/2008 | Watanabe et al. ............. 257/233 |
| 2008/0029793 | A1 | 2/2008 | Watanabe et al. ............. 257/291 |

FOREIGN PATENT DOCUMENTS

| JP | 2001-332714 A | 11/2001 |
| JP | 2006-073732 A | 3/2006 |
| JP | 2006-261411 A | 9/2006 |
| JP | 2007-081033 A | 3/2007 |
| JP | 2007-095917 A | 4/2007 |

* cited by examiner

Primary Examiner — Daniel M Pasiewicz
(74) Attorney, Agent, or Firm — Fitzpatrick, Cella, Harper & Scinto

(57) ABSTRACT

In a photoelectric conversion device, groups of unit pixels are arranged in a well, where each of the unit pixels includes photoelectric conversion elements, an amplifier transistor, and transfer transistors. The photoelectric conversion device includes a line used to supply a voltage to the well, a well-contact part used to connect the well-voltage-supply line to the well, and transfer-control lines used to control the transfer transistors. The transfer-control lines are symmetrically arranged with respect to the well-voltage-supply line in respective regions of the unit-pixel groups.

15 Claims, 7 Drawing Sheets

PHOTOELECTRIC CONVERSION DEVICE AND IMAGE-PICKUP APPARATUS

CROSS REFERENCE TO RELATED APPLICATION

This application is a continuation of U.S. application Ser. No. 12/050,326, filed on Mar. 18, 2008, the entire disclosure of which is incorporated by reference herein.

BACKGROUND OF THE INVENTION

1. Field of the Invention

The present invention relates to a photoelectric conversion device including unit cells arranged in a well, where each of the unit cells includes a plurality of photoelectric conversion elements, and to an image pickup apparatus including the photoelectric conversion device.

2. Description of the Related Art

Solid-state image pickup devices manufactured by using complementary metal oxide semiconductor (CMOS) technologies have been shown to be high performance, multifunctional, and low power solid-state image pickup devices. The above-described solid-state image pickup devices are also referred to as CMOS image sensors. Japanese Patent Laid-Open No. 2001-332714 discloses a diagram (FIG. 4) showing a circuit including a contact part used to fix the potential of a well, the contact part being provided for each of a plurality of unit cells, where each unit cell includes two pixels.

When a contact part used to fix the well potential is provided for each of the plurality of unit cells, where each unit cell includes at least two pixels, the symmetry of the layout of conductive lines and/or elements provided in the region of the unit cell becomes irregular, i.e., the layout is non-symmetrical, which may produce a fixed pattern noise. Japanese Patent Laid-Open No. 2001-332714 does not disclose nor suggest an example of a layout of the conductive lines and/or the elements provided in the region of the unit cell. Further, there is no discussion in Japanese Patent Laid-Open No. 2001-332714 of the effect the symmetry of the layout of the conductive lines and/or the elements provided in the region of the unit cell can affect a fixed pattern noise.

SUMMARY OF THE INVENTION

The present invention provides, for example, a photoelectric conversion device having an increased layout symmetry in the region of a unit cell.

According to an embodiment of the present invention, a photoelectric conversion device including unit cells arranged in a well is provided, where each of the unit cells includes a plurality of photoelectric conversion elements, an amplifier transistor, and a plurality of transfer transistors arranged between the photoelectric conversion elements and a gate electrode of the amplifier transistor. In the photoelectric conversion device, each of the unit cells includes a well-voltage-supply line configured to supply a voltage to the well, a well-contact part used to connect the well-voltage-supply line, and plural transfer-control lines configured to respectively control the transfer transistors. In the region of the unit cell, the plural transfer-control lines are symmetrically arranged with respect to the well-voltage-supply line.

Other features and advantages of the present invention will be apparent from the following description of exemplary embodiments taken in conjunction with the accompanying drawings, in which like reference characters designate the same or similar parts throughout the figures thereof.

The accompanying drawings, which are incorporated in and constitute a part of the specification, illustrate embodiments of the present invention and, together with the description, serve to explain the principles of the present invention.

DESCRIPTION OF THE EMBODIMENTS

First Embodiment

Hereinafter, embodiments of the present invention will be described with reference to the attached drawings.

Figure 1:
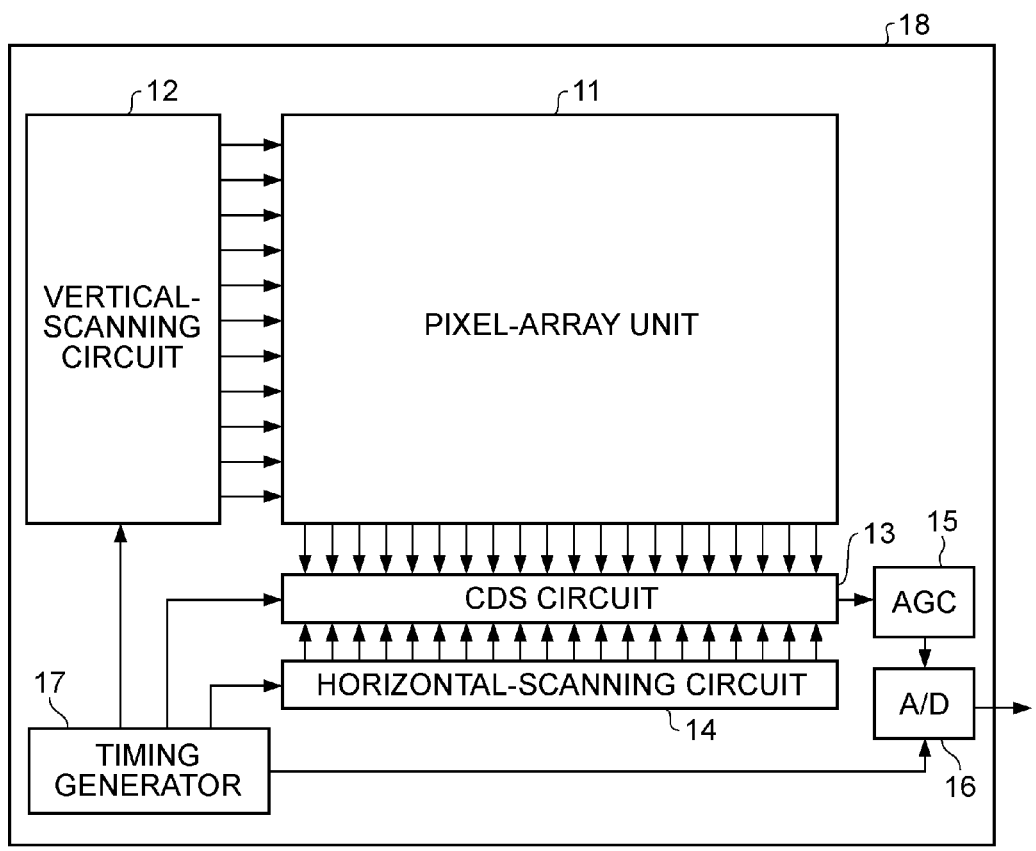
FIG. 1 shows a schematic configuration of a photoelectric conversion device according to an embodiment of the present invention.

FIG. 1 is a diagram showing a schematic configuration of a photoelectric conversion device 100 according to an embodiment of the present invention. When being used to perform imaging, the photoelectric conversion device 100 can be referred to as a solid-state image pickup device and/or a complementary metal oxide semiconductor (CMOS) image sensor. In FIG. 1, the photoelectric conversion device 100 includes a pixel-array unit 11, a vertical-scanning circuit 12, a correlated double sampling (CDS) circuit 13, and a horizontal-scanning circuit 14. The photoelectric conversion device 100 further includes an automatic gain control (AGC) circuit 15, an analog-to-digital (A/D) conversion circuit 16, and a timing generator 17. The above-described blocks 11 to 17 are integrated onto a semiconductor substrate (chip) 18.

In the pixel-array unit 11, a plurality of unit cells is arranged in a well of the semiconductor substrate (corresponding to a P well 62 which will be described later) in a two-dimensional manner. Each of the unit cells includes a plurality of pixels (photoelectric conversion elements). Typically, one-to-one correspondence is established between a single pixel and a single row.

The CDS circuit 13 includes a plurality of unit-CDS circuits. Each of the unit-CDS circuits is correspondingly arranged for every single pixel column and/or plurality of pixel columns of the pixel-array unit 11, and configured to perform CDS processing for a signal read from a row selected by the vertical-scanning circuit 12 via a signal-output line 33 (shown in FIG. 2). More specifically, the CDS circuit 13 outputs a signal corresponding to the difference between a reset-level signal and a signal-level signal that is output from each of the pixels. Subsequently, fixed pattern noises occurring due to variations in the reset levels of the pixels are removed.

The horizontal-scanning circuit 14 sequentially selects signals stored for each of the pixel columns after being subjected to the CDS processing by the CDS circuit 13. The AGC circuit 15 amplifies the signals of the column selected by the horizontal-scanning circuit 14 with an appropriate gain. The A/D-conversion circuit 16 converts an analog signal amplified by the AGC circuit 15 into a digital signal and transmits the digital signal to outside of the photoelectric conversion device 100. The timing generator 17 generates various types of timing signals and drives the vertical-scanning circuit 12, the CDS circuit 13, the horizontal-scanning circuit 14, the AGC circuit 15, and the A/D-conversion circuit 16 by using the timing signals.

The above-described configuration is an example configuration of a photoelectric conversion device according to an embodiment of the present invention. However, the present invention is not limited to the above-described configuration. For example, the A/D-conversion circuit 16 may be omitted from the photoelectric conversion device 100. According to another embodiment of the present invention, the A/D-conversion circuit 16 may be provided for each of the pixel columns. According to yet another embodiment of the present invention, a plurality of output systems may be provided, where each of the output systems includes a CDS circuit 13, an AGC circuit 15, etc.

Figure 2:
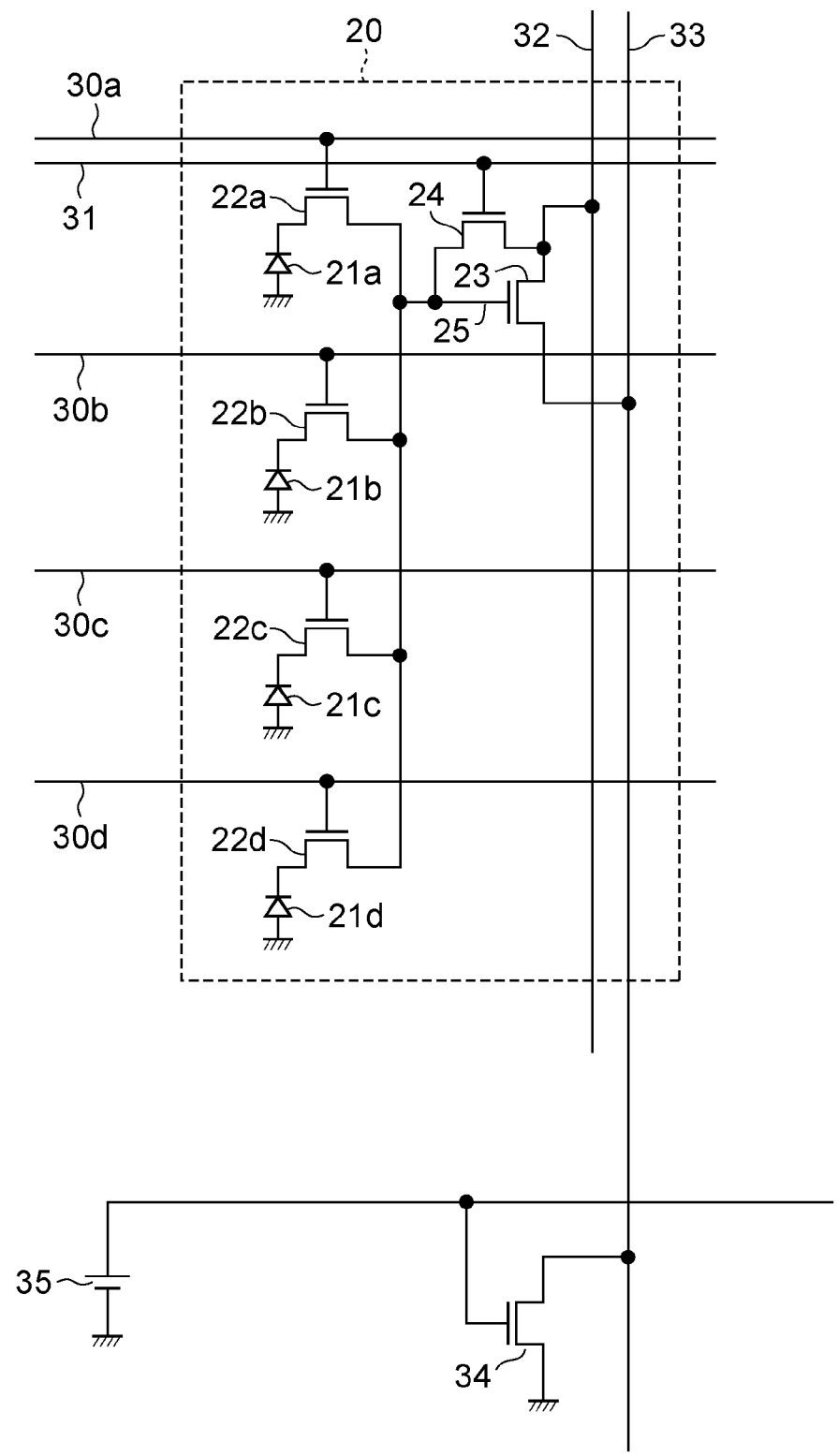
FIG. 2 is a circuit diagram showing an example configuration of a single unit cell.

FIG. 2 is a circuit diagram showing an example configuration of a single unit cell 20. Each of the unit cells 20 includes, for example, photoelectric conversion elements 21a, 21b, 21c, and 21d, transfer transistors 22a, 22b, 22c, and 22d, a single floating diffusion (hereinafter referred to as FD) unit 25, a single amplifier transistor 23, and a single reset transistor 24 as circuit components. Here, each of the unit cells 20 includes the four photoelectric conversion elements 21a to 21d, that is, four pixels, for example. Here, the term "unit cell" may denote a group of unit pixels or a unit-pixel group.

Each of the unit cells 20 further includes the above-described signal-output line 33, transfer-control lines 30a, 30b, 30c, and 30d, and a reset-signal line 31. Typically, the signal-output line 33 is shared among the unit cells 20 provided on the same column. Typically, the transfer-control lines 30a to 30d and the reset-signal line 31 are shared among the unit cells 20 arranged in the row direction. Each of the unit cells 20 includes a line used to supply a voltage to the well (hereinafter referred to as a voltage-supply line), as a conductive line. The details on the voltage-supply line will be described later.

The anode of each of the photoelectric conversion elements 21a to 21d is grounded, and each of the photoelectric conversion elements 21a to 21d performs photoelectric conversion of incident light so that the incident light is converted into electric carriers (electrons and/or positive holes) corresponding to the amount of incident light converted, and the electric carriers are accumulated. Each of the transfer transistors 22a to 22d transfers electric carriers generated in the photoelectric conversion element corresponding to the transfer transistor to the FD unit 25. More specifically, the sources of the transfer transistors 22a to 22d are connected to the cathodes of the photoelectric conversion elements 21a to 21d corresponding to the transfer transistors 22a to 22d, and the gates of the transfer transistors 22a to 22d are connected to the transfer-control lines 30a to 30d corresponding to the transfer transistors 22a to 22d. Further, the drains of the transfer transistors 22a to 22d are connected to the FD unit 25 and the gate of the amplifier transistor 23.

The transfer transistors 22a to 22d are provided between the photoelectric conversion elements 21a to 21d and the gate electrode of the single amplifier transistor 23. When the potential level of each of the transfer-control lines 30a to 30d becomes high, electric carriers accumulated in the photoelectric conversion elements 21a to 21d are transferred to the FD unit 25. The FD unit 25 accumulates electric carriers transferred from a single photoelectric conversion element selected from among the photoelectric conversion elements 21a to 21d via the transfer transistor corresponding to the selected single photoelectric conversion element. The potential of the FD unit 25 is determined according to the amount of electric carriers transferred to the FD unit 25.

The gate of the amplifier transistor 23 is connected to the FD unit 25, the drain of the amplifier transistor 23 is connected to a power line 32, and the source of the amplifier transistor 23 is connected to the signal-output line 33. The amplifier transistor 23 outputs a signal to the signal-output line 33 based on the electric carriers accumulated on the FD unit 25.

The source of the reset transistor 24 is connected to the FD unit 25 and the gate of the amplifier transistor 23, the drain of the reset transistor 24 is connected to the power line 32, and the gate of the reset transistor 24 is connected to the reset-signal line 31. When the potential of the reset-signal line 31 becomes high, the reset transistor 24 resets the potential of the FD 25, that is, the potential of the gate of the amplifier transistor 23 to that of the power line 32.

According to the above-described embodiment, the drains of the transfer transistors 22a to 22d are connected to one another so that the single FD unit 25 is used. Namely, the amplifier transistor 23 is shared among the photoelectric conversion elements 21a to 21d. Consequently, the area occupied by the transistors provided in a single pixel can be reduced, and the aperture ratio (the ratio between the area of a single pixel and the aperture area of the photoelectric conversion element) can be increased. It is preferable that each of the transfer transistors 22a to 22d, the amplifier transistor 23, and the reset transistor 24 includes an N-type metal-oxide-semiconductor (MOS) transistor. However, each of the above-described transistors may include a P-type MOS transistor.

The vertical-scanning circuit 12 selects a row for reading from among rows provided in the pixel-array unit 11. The selection of a row for reading is achieved by controlling the potential of the FD unit 25 provided in the unit cell 20 to which pixels of the row selected for reading belong, via the reset transistor 24, so that the amplifier transistor 23 is turned on, and by activating the transfer transistors of the row selected for reading. As for other pixels provided in the unit cell 20 to which the pixels of the row selected for reading belong, the transfer transistors corresponding to the other pixels are maintained in an inactive state. Therefore, the other pixels are not selected. Further, in a unit cell to which the row selected for reading does not belong, the potential of the FD unit 25 of that unit cell is controlled via the reset transistor 24 so that the amplifier transistor 23 is not turned on.

Of the unit cells 20 arranged in the well in the two-dimensional manner, unit cells provided along the same column are connected in parallel to the signal-output line 33. Further, the CDS circuit 13 and a transistor 34 including a constant current circuit are connected to the signal-output line 33. The gate of the transistor 34 is biased by a constant voltage transmitted from a bias-power unit 35, and the transistor 34 operates as the source of a constant current.

When the potential of the FD unit 25 is reset to a potential by which the amplifier transistor 23 is turned on in the above-described unit cell 20, the amplifier transistor 23 and the transistor 34 including the constant current circuit form a source follower. Subsequently, the signal corresponding to a potential obtained by decreasing the potential of the gate of the amplifier transistor 23 by as much as a voltage obtained between the source and the gate of the amplifier transistor 23 is output to the signal-output line 33.

According to the above-described photoelectric conversion device 100, a well contact is provided for each of the unit cells 20 of the pixel-array unit 11. Subsequently, it becomes possible to prevent the areas of the photoelectric conversion element and the aperture ratio from being reduced, and to prevent an output signal from being shaded, the shading occurring due to fluctuations in the well potential.

Figure 3:
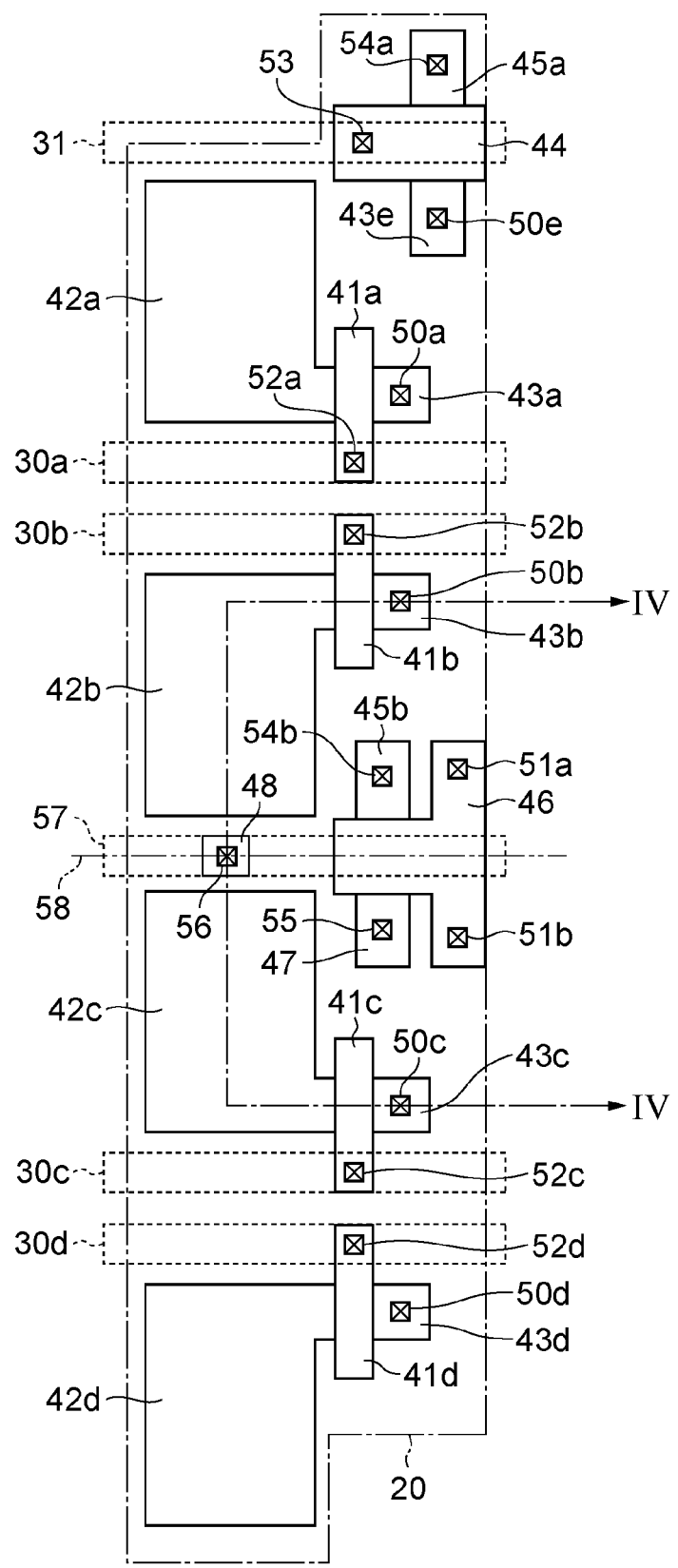
FIG. 3 is a planar pattern figure (a layout diagram) showing an example configuration of the unit cell shown in FIG. 2.

FIG. 3 is a planar pattern figure (a layout diagram) showing an example configuration of the unit cell 20 shown in FIG. 2. In FIG. 3, gate electrodes 41a to 41d are respectively provided between photoelectric conversion regions (active regions) 42a, 42b, 42c, and 42d of the photoelectric conversion elements 21a to 21d, and FD units 43a, 43b, 43c, and 43d, so that gate electrodes of the transfer transistors 22a to 22d are formed. The FD units 43a to 43d are drain regions of the transfer transistors 22a to 22d. A gate electrode 46, a source region 47, and a drain region 45b form the amplifier transistor 23. A gate electrode 44, a source region 43e, and a drain region 45a form the reset transistor 24.

Each of the gate electrodes 41a to 41d, 44, and 46 may include polysilicon. The gate electrodes 41a to 41d of the transfer transistors 22a to 22d are respectively connected to the transfer-control lines 30a to 30d, which are conductive lines, via contact parts 52a, 52b, 52c, and 52d. The gate electrode 44 of the reset transistor 24 is connected to the reset-signal line 31, which is a conductive line, via a contact part 53.

The FD units 43a to 43d, the gate electrode 46 of the amplifier transistor 23, and the source region 43e of the reset transistor 24 are electrically connected to one another via contact parts 50a, 50b, 50c, 50d, 51a, 51b, and 50e, and at least one conductive line (not shown). Then, the FD units 43a to 43d, the gate electrode 46, and the source region 43e are used, as the FD unit 25. The drain region 45a of the reset transistor 24 and the drain region 45b of the amplifier transistor 23 are connected to the power line 32, which is a conductive line (not shown), via contact parts 54a and 54b. The source region 47 of the amplifier transistor 23 is connected to the signal-output line 33, which is a conductive line (not shown), via a contact part 55.

In the above-described embodiment, a single well-contact region 48 is provided for the single unit cell 20. The well-contact region 48 is electrically connected to a line 57 used to supply a voltage to a well (hereinafter referred to as a voltage-supply line 57) via a well-contact part 56, where the voltage-supply line 57 extends in the row direction to supply a well voltage, for example, a ground-level signal. Subsequently, the voltage of the well can be fixed. The voltage-supply line 57, the transfer-control lines 30a to 30d, and the reset-signal line 31 are arranged such that they are parallel to one another.

According to the above-described embodiment, in the region of each of the unit cells 20, the transfer-control lines 30a to 30d are symmetrically arranged with respect to the voltage-supply line 57 (a virtual line 58 is provided for illustration and is discussed below). According to the above-described embodiment, therefore, the symmetry of conductive lines provided in the region of each of the unit cells 20 is increased, which reduces fixed pattern noises.

Further, according to the above-described embodiment, the photoelectric conversion regions (active regions) 42b and 42c are provided between the transfer-control lines 30b and 30c and the voltage-supply line 57 so that the transfer-control lines 30b and 30c and the voltage-supply line 57 can be provided at a sufficient distance from one another. Consequently, it becomes possible to reduce the parasitic capacitance between the transfer-control lines 30b and 30c and the voltage-supply line 57, as well as fluctuations in the potential of the voltage-supply line 57, where the potential fluctuations occur due to fluctuations in the potentials of the transfer-control lines 30b and 30c. Also consequently, it becomes possible to reduce shading caused by the fluctuations in the well potential, where the shading particularly occurs when the photoelectric conversion device 100 operates with high speed.

Further, according to the above-described embodiment, the amplifier transistor 23 (the gate electrode 46, the drain region 45b, and the source region 47) is provided in the region of each of the unit cells 20 so that the virtual line 58 extends through the gate electrode 46 of the amplifier transistor 23. Here, the virtual line 58 is parallel to the voltage-supply line 57 and the transfer-control lines 30a to 30d and extends through the well-contact part 56. The above-described configuration is effective to reduce irregularities in the symmetry, the irregularities caused by providing the single amplifier transistor and the single well-contact part in the unit cell 20.

Further, according to the above-described embodiment, the two reset-signal lines 31 adjacent to each other are symmetrically arranged with respect to the voltage-supply line 57 provided between the two reset-signal lines 31. Because FIG. 3 shows the configuration of the single unit cell 20 only, the single reset-signal line 31 is shown. When a plurality of the above-described unit cells 20 is arranged in a one-dimensional manner and/or a two-dimensional manner, the two adjacent reset-signal lines 31 are symmetrically arranged with respect to the voltage-supply line 57 provided between the two adjacent reset-signal lines 31. The reset-signal line 31 can be provided on an end part of the region of each of the unit cells 20, and the reset transistor 24 (the gate electrode 44, the drain region 45a, and the source region 43e) can be provided on the end part of the region of each of the unit cells 20. The end part denotes a part of the region of the unit cell 20, the part being close to the boundary between the above-described unit cell 20 and a different unit cell 20 adjacent to the above-described unit cell 20. More specifically, in FIG. 3, the end part becomes the boundary between the unit cells 20 that are adjacent to each other in the column direction.

Further, according to the above-described embodiment, the photoelectric conversion regions 42a to 42d of the photoelectric conversion elements 21a to 21d are symmetrically arranged with respect to the voltage-supply line 57 in the region of each of the unit cells 20. Subsequently, the symmetry of layout of the unit cell 20 can further be increased and fixed-pattern noises can be reduced.

Further, according to the above-described embodiment, the transfer-control line and the reset-signal line, and/or the transfer-control line and the voltage-supply line are symmetrically arranged with respect to each of the photoelectric conversion elements.

Further, in the above-described embodiment, mirror symmetry is achieved by a part including the single photoelectric conversion element 21a and the single transfer transistor 22a connected thereto, and a part including the other single photoelectric conversion element 21b and the other single transfer transistor 22b connected thereto. Further, the mirror symmetry is also achieved by a part including the single photoelectric conversion element 21c and the single transfer transistor 22c connected thereto, and a part including the other single photoelectric conversion element 21d and the other single transfer transistor 22d connected thereto. The mirror symmetry is also achieved by a part including the photoelectric conversion elements 21a and 21b, and the transfer transistors 22a and 22b, and a part including the photoelectric conversion elements 21c and 21d and the transfer transistors 22c and 22d. According to the above-described mirror-symmetrical arrangement, the length of the conductive line used to connect the FD units provided in the unit cell to the gate of the amplifier transistor in common can be shorter than that obtained in the case where translational-symmetrical arrangement is achieved. Consequently, the degree of liberty in arranging the amplifier transistor and/or the reset transistor in each of the unit cells 20 increases.

On the other hand, according to another embodiment of the present invention, the photoelectric conversion elements (the photoelectric conversion regions) may be arranged in a translational-symmetrical manner. In FIG. 3, for example, a photoelectric conversion region having the same shape as that obtained by translating the photoelectric conversion region 42a may be arranged in place of the photoelectric conversion regions 42b and 42d. In that case, the amplifier transistor and the reset transistor may be moved.

Hereinafter, an example where a color filter is assigned to each of the photoelectric conversion regions under the Bayer arrangement system in the example arrangement shown in FIG. 3 is considered. For example, if a red color filter is assigned to the photoelectric conversion region 42a, another red color filter is assigned to the photoelectric conversion region 42c. In that case, the arrangement relationship between the conductive lines of the photoelectric conversion region 42a where the red color filter is assigned becomes equivalent to that between conductive lines of the photoelectric conversion region 42c where the red color filter is assigned. Likewise, the arrangement relationship between conductive lines of a photoelectric conversion region where a different color filter is assigned becomes equivalent to that between conductive lines of a photoelectric conversion region where another color filter of the different color is also assigned. Namely, as for photoelectric conversion regions where color filters of the same color are assigned, the transfer-control line, and the reset-signal line and/or the voltage-supply line of one of the photoelectric conversion regions and those of the other photoelectric conversion regions are symmetrically arranged with respect to the photoelectric conversion region. The above-described arrangement allows for reducing variations in the incident-light amounts among the photoelectric conversion elements (photoelectric conversion regions) of the same color. The same effect can be obtained even though the photoelectric conversion elements are arranged in a mirror-symmetrical manner or the translational-symmetrical manner.

Figure 4:
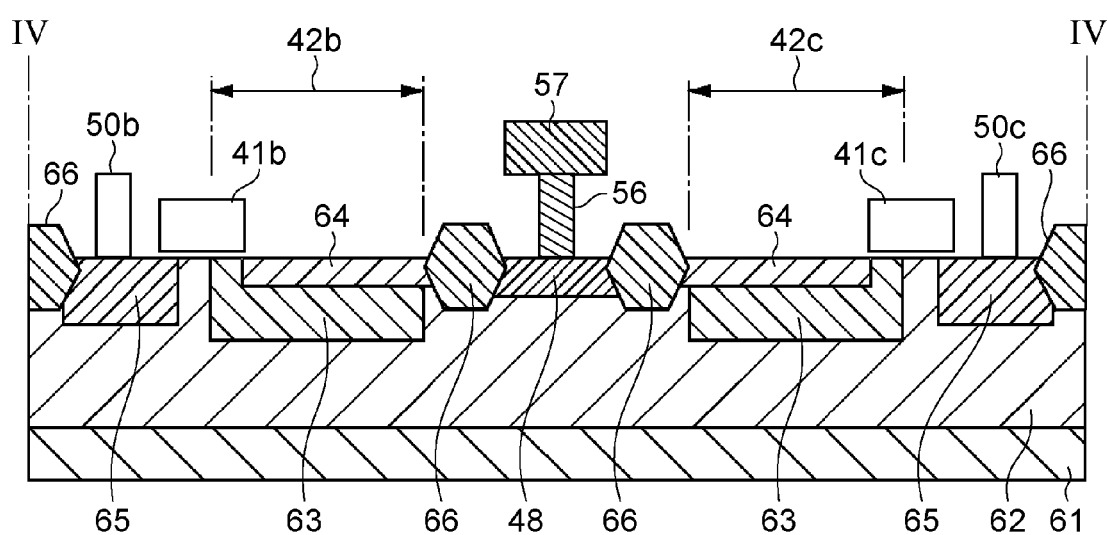
FIG. 4 is a sectional view of the unit cell cut along the line IV-IV shown in FIG. 3.

FIG. 4 is a sectional view of the unit cell 20 cut along the line IV-IV shown in FIG. 3. According to an example shown in FIG. 4, a P well 62 is provided in an N-type substrate 61, and photoelectric conversion elements and/or transistors forming a pixel and/or a unit cell are provided in the P well 62. N-type regions 65 are provided as active regions (the active regions 43b and 43c shown in FIG. 3) connected to the gate electrode 46 of the amplifier transistor 23 via the contact parts 50b and 50c, and a conductive line (not shown).

Each of the photoelectric conversion regions 42b and 42c includes an N-type impurity region 63, a P+ region 64 near the surface, and part of the P well 62, with the part surrounding the N-type impurity region 63 and the P+ region 64. A P+ region 48 is an active region (a well-contact region) connected to the voltage-supply line 57 via the well-contact part 56. The potential of the P well 62 is fixed to the well voltage such as the ground level via the voltage-supply line 57 and the P+ region 48. Each of element-separation regions 66 is formed by using local oxidization on silicon (LOCOS) technologies, shallow trench isolation (STI) technologies, and so forth. The element-separation region 66 is provided between the photoelectric conversion elements and/or the transistors so that the elements are electrically separated.

Figure 5:
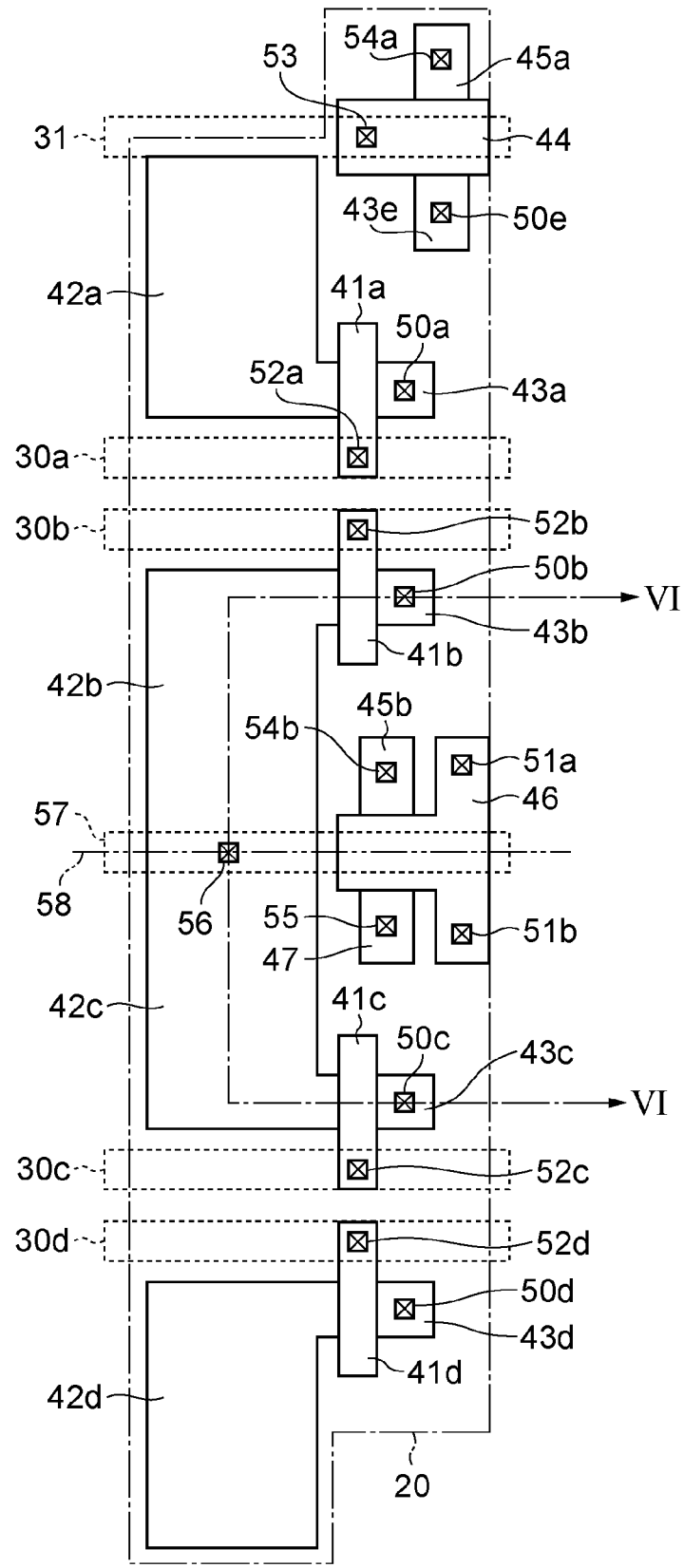
FIG. 5 is a planar pattern figure (a layout diagram) showing another example configuration of the unit cell shown in FIG. 2.
Figure 6:
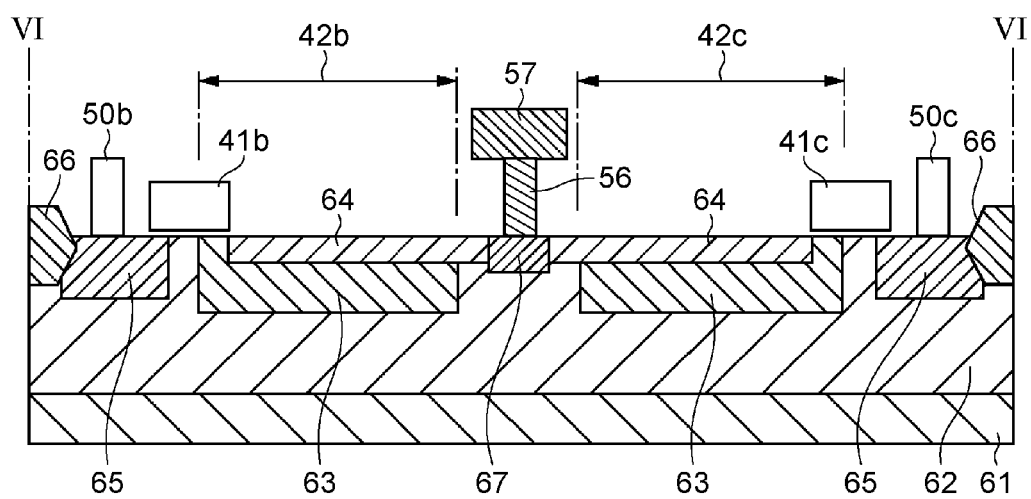
FIG. 6 is a sectional view of the unit cell cut along the line VI-VI shown in FIG. 5.

FIG. 5 is a planar pattern figure (a layout diagram) showing another example configuration of the unit cell 20 shown in FIG. 2. FIG. 6 is another sectional view of the unit cell 20 cut along the line VI-VI shown in FIG. 5. Each of the photoelectric conversion regions 42b and 42c includes the N-type impurity region 63, the P+ region 64 near the surface, and the part of the P well 62, with the part surrounding the N-type impurity region 63 and the P+ region 64. A P+ region 67 is an active region (a well-contact region) connected to the voltage-supply line 57 via the well-contact part 56. The potential of the P well 62 is fixed to the well voltage such as the ground level via the voltage-supply line 57 and the P+ region 67.

P+ impurity ions are implanted in the P+ region 67 at a density higher than that in the P+ region 64 near the surface of each of the photoelectric conversion regions 42b and 42c so that the photoelectric conversion regions 42b and 42c can be prevented from being affected by the well-contact region. Each of the element-separation regions 66 is formed by using the local oxidization on silicon (LOCOS) technologies, the shallow trench isolation (STI) technologies, and so forth. The element-separation region 66 is provided between the photoelectric conversion elements and/or the transistors so that the elements are electrically separated.

Here, in addition to the P+ region 67, an impurity region used for connection may be formed by implanting impurity ions through a contact hole used to provide the well-contact part 56. The level of the density of the impurity region used for connection is set to somewhere in between those of the densities of the P+ regions 64 and 67, for example.

Further, the P+ region 67 need not be provided. In that case, the impurity region used for connection may be formed in the P+ region 64 by implanting impurity ions through the contact hole used to form the contact part 56. The use of the contact hole allows for forming an impurity region of the same size as that of the base of the contact part 56, which increases the aperture ratio. Further, a depletion layer of the photoelectric conversion element is less affected than in the case where the P+ region 67 with a high impurity density is used.

According to the above-described embodiment, the photoelectric conversion elements include, at least, a first photoelectric conversion region 42b (a first photoelectric conversion element 21b) and a second photoelectric conversion region 42c (a second photoelectric conversion element 21c). Further, in the region of each of the unit cells 20, the first photoelectric conversion region 42b and the second photoelectric conversion region 42c are provided in the same active region (a region provided between the two element-separation regions 66, as shown in FIG. 5). Further, the well-contact region 67 (the well-contact part 56) is also provided in the same active region as that where the first photoelectric conversion region 42b and the second photoelectric conversion region 42c are provided. Thus, the well-contact region 67 (the well-contact part 56) is provided so that the aperture ratio is prevented from being decreased.

In each of the configurations exemplified in the above-described embodiments in detail, each of the unit cells 20 includes four pixels. However, the present invention can be used for a configuration where every unit cell includes at least two pixels.

According to each of the above-described embodiments, each of the conductive lines has a predetermined width specified by a semiconductor process and/or design used. However, the shape of each of the conductive lines may be modified so that the width of part of the conductive line is increased, which constitutes another embodiment of the present invention.

Figure 7:
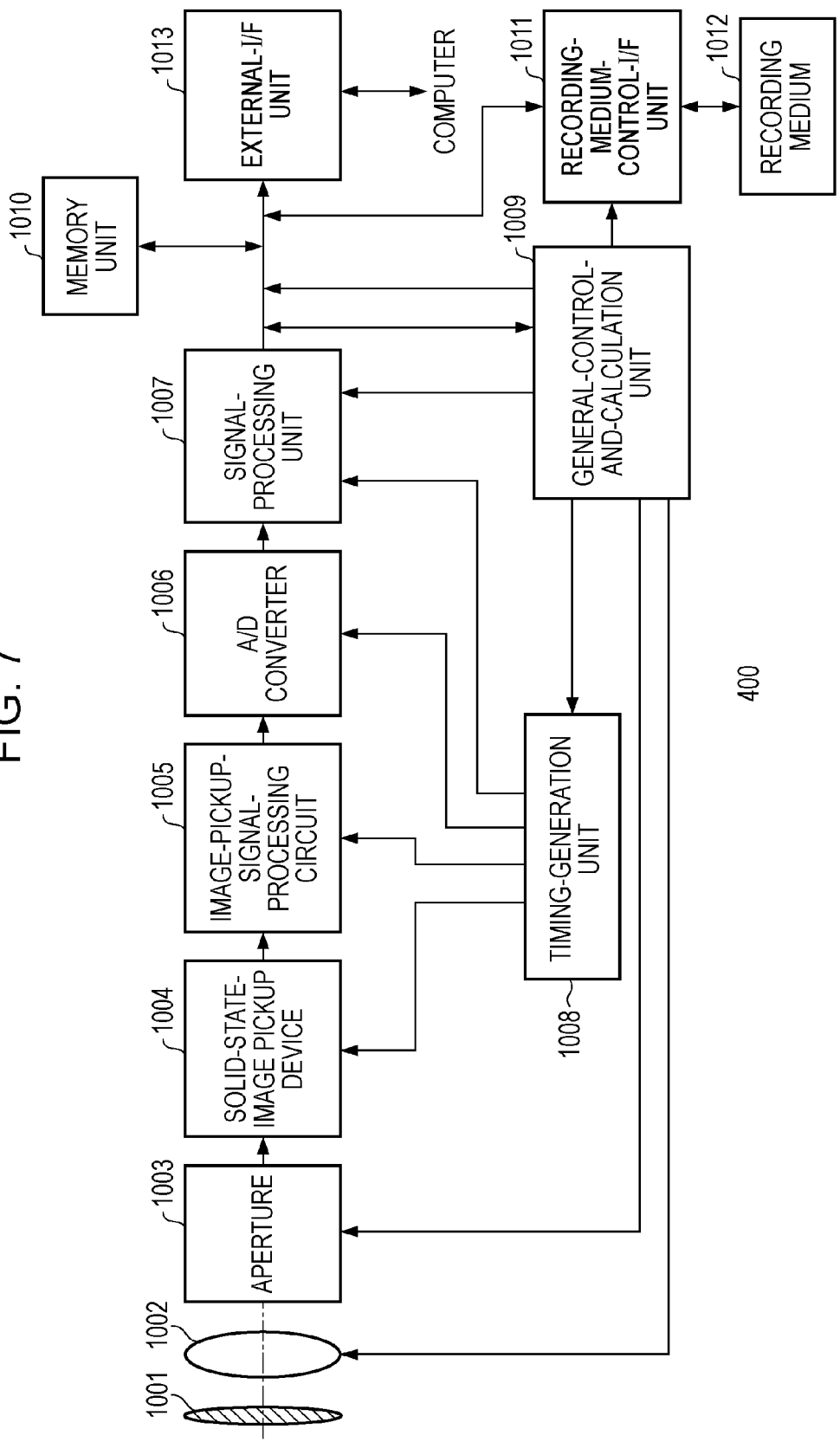
FIG. 7 shows a schematic configuration of an image pickup apparatus according to an embodiment of the present invention.

FIG. 7 shows the schematic configuration of an image pickup apparatus 400 according to an embodiment of the present invention. The image pickup apparatus 400 includes a solid-state image pickup device 1004 typified by the above-described photoelectric conversion device 100. An optical image of a subject is formed on the imaging surface of the solid-state image pickup device 1004 through a lens 1002. A barrier 1001 can be provided outside the lens 1002 to protect the lens 1002 and function as a main switch. The lens 1002 may include an aperture 1003 used to adjust the amount of light emitted from the lens 1002. Imaging signals output from the solid-state image pickup device 1004 over at least two channels are subjected to various types of correction processing, clamp processing, etc., through an imaging-signal-processing circuit 1005. The imaging signals output from the imaging-signal-processing circuit 1005 over the at least two channels are subjected to analog-to-digital conversion in an A/D converter 1006. Image data output from the A/D converter 1006 is subjected to various types of correction processing, data compression, etc., through a signal-processing unit 1007. Each of the solid-state image pickup device 1004, the imaging-signal-processing circuit 1005, the A/D converter 1006, and the signal-processing unit 1007 operates according to a timing signal generated by a timing-generation unit 1008.

Each of the imaging-signal-processing circuit 1005, the A/D converter 1006, the signal-processing unit 1007, and the timing-generation unit 1008 may be provided on the same chip as that where the solid-state image pickup device 1004 is provided. Each of the above-described components of the image pickup apparatus 400 is controlled by a unit 1009 configured to generally control the image pickup apparatus 400 and perform calculations. The image pickup apparatus 400 further includes a memory unit 1010 used to temporarily store image data and an interface (I/F) unit 1011 that is used to control a recording medium 1012 to record and/or read image data onto and/or from the recording medium 1012. The recording medium 1012 includes, for example, a semiconductor memory, and can be inserted and/or removed into and/or from the recording-medium-control I/F unit 1011. The image pickup apparatus 400 may further include an external interface (I/F) unit 1013 used to communicate with an external computer, etc.

Next, operations of the image pickup apparatus 400 shown in FIG. 7 will be described. When the barrier 1001 is opened, the main power, the power of a control system, and the powers of imaging-system circuits including the A/D converter 106, etc., are turned on in sequence. After that, the general-control-and-calculation unit 1009 minimizes the value of the aperture 1003 to control the exposure amount. A signal output from the solid-state image pickup device 1004 is transmitted through the imaging-signal-processing circuit 1005 and presented to the A/D converter 1006. The A/D converter 1006 performs A/D conversion for the signal and transmits digital data obtained through the A/D conversion to the signal-processing unit 1007. The signal-processing unit 1007 processes the digital data, presents the processed data to the general-control-and-calculation unit 1009. The general-control-and-calculation unit 1009 performs calculations to determine the exposure amount. The general-control-and-calculation unit 1009 controls the aperture 1003 based on the determined exposure amount.

Next, the general-control-and-calculation unit 1009 retrieves a high-frequency component from the signal that is output from the solid-state image pickup device 1004 and that is processed by the signal-processing unit 1007, and calculates the distance between the image pickup apparatus 400 and the subject based on the high-frequency component. After that, the general-control-and-calculation unit 100 drives the lens 1002 and determines whether a focus is achieved. If it is determined that no focus is achieved, the general-control-and-calculation unit 100 drives the lens 1002 again and calculates the above-described distance.

After it is determined that the focus is achieved, a main exposure is started. After the main exposure is finished, an imaging signal output from the solid-state image pickup device 1004 is subjected to correction processing, etc., in the imaging-signal-processing circuit 1005, A/D-converted into image data by the A/D converter 1006, and processed by the signal-processing unit 1007. The general-control-and-calculation unit 1009 accumulates the image data processed by the signal-processing unit 1007 on the memory unit 1010.

After that, the image data accumulated on the memory unit 1010 is recorded onto the recording medium 1012 via the recording-medium-control I/F unit 1011 under the control of the general-control-and-calculation unit 1009. Further, the image data can be presented and processed by a computer, etc., via the external-I/F unit 1013.

Here, the image pickup apparatus 400 can be used, for example, as a digital-still camera, a video camera, and a camera module mounted on a terminal device including a mobile phone, etc.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-107625 filed on Apr. 16, 2007, which is hereby incorporated by reference herein in its entirety.

What is claimed is:

1. A photoelectric conversion device comprising:
   unit cells arranged in a well, each of the unit cells including a plurality of photoelectric conversion elements;
   an amplifier transistor; and
   a plurality of transfer transistors arranged between the plurality of photoelectric conversion elements and a gate electrode of the amplifier transistor,
   wherein each of the unit cells includes:
      a well-voltage-supply line configured to supply a voltage to the well;
      a well-contact part used to connect the well-voltage-supply line, wherein, in a region of the unit cell, the well-contact part is disposed between a first photoelectric conversion element of the plurality of photoelectric conversion elements and a second photoelectric conversion element of the plurality of photoelectric conversion elements, and the first photoelectric conversion element is adjacent to the second photoelectric conversion element; and
      plural transfer-control lines configured to control the plurality of transfer transistors, respectively, wherein, in a region of the unit cell, the plural transfer-control lines are symmetrically arranged with respect to the well-voltage-supply line.

2. The photoelectric conversion device according to claim 1,
   wherein the well-voltage-supply line and the plural transfer-control lines are parallel to one another, and wherein, in the region of the unit cell, the amplifier transistor is arranged so that a virtual line extends through the gate electrode of the amplifier transistor, such that the virtual line is parallel to the well-voltage-supply line and the plural transfer-control lines and extends through the well-contact part.

3. The photoelectric conversion device according to claim 1,
wherein the plurality of photoelectric conversion elements includes, at least, a first photoelectric conversion element and a second photoelectric conversion element, and
wherein the first and second photoelectric conversion elements are provided in a same active region in the region of the unit cell.

4. The photoelectric conversion device according to claim 1, wherein each of the unit cells is further comprised of:
a reset transistor configured to reset a potential of the gate electrode of the amplifier transistor; and
a reset-signal line configured to control the reset transistor,
wherein the well-voltage-supply line, the plural transfer-control lines, and the reset-signal line are parallel to one another, and
wherein respective reset-signal lines of two-adjacent unit cells are symmetrically arranged with respect to the well-voltage-supply line provided between the two reset-signal lines.

5. The photoelectric conversion device according to claim 1, wherein the plurality of photoelectric conversion elements are symmetrically arranged with respect to the well-voltage-supply line in a region of the unit cell.

6. The photoelectric conversion device according to claim 1, wherein a number of the plurality of photoelectric conversion elements provided in each unit cell is four.

7. An image pickup apparatus comprising:
a photoelectric conversion device that includes unit cells arranged in a well, each of the unit cells including a plurality of photoelectric conversion elements, an amplifier transistor, and a plurality of transfer transistors arranged between the plurality of photoelectric conversion elements and a gate electrode of the amplifier transistor, wherein each of the unit cells includes:
a well-voltage-supply line configured to supply a voltage to the well;
a well-contact part used to connect the well-voltage-supply line, wherein, in a region of the unit cell, the well-contact part is disposed between a first photoelectric conversion element of the plurality of photoelectric conversion elements and a second photoelectric conversion element of the plurality of photoelectric conversion elements, and the first photoelectric conversion element is adjacent to the second photoelectric conversion element;
plural transfer-control lines configured to control the transfer transistors, respectively, wherein, in a region of the unit cell, the plural transfer-control lines are symmetrically arranged with respect to the well-voltage-supply line; and
a processing circuit configured to process a signal presented by the photoelectric conversion device.

8. The photoelectric conversion device according to claim 1, wherein each of the plurality of photoelectric conversion elements includes a first type impurity region and a second type region, and the well-contact part is electrically connected to the second type region.

9. The photoelectric conversion device according to claim 1, wherein, in a region of the unit cell, the plural transfer-control lines and the well-voltage-supply line are perpendicular to an arrangement direction of the plurality of photoelectric conversion elements.

10. The photoelectric conversion device according to claim 1, wherein, in the region of the unit cell, an element-separation region is not provided between two of the plurality of photoelectric conversion elements, and the two of the plurality of photoelectric conversion elements are provided in a region between element-separation regions.

11. The photoelectric conversion device according to claim 1,
wherein each of the unit cells further includes a reset transistor that resets a potential of the gate electrode, and a reset-signal line used to control the reset transistor,
wherein the well-voltage-supply line, the plural transfer-control lines, and the reset-signal line are arranged to be parallel to one another, and
wherein two reset-signal lines, which are adjacent to each other, are symmetrically arranged with respect to the well-voltage-supply line located between the two reset-signal lines.

12. The photoelectric conversion device according to claim 11, wherein the reset transistor is provided on an end part of the region of the unit cell.

13. The photoelectric conversion device according to claim 1, wherein the photoelectric conversion device is incorporated in an image pickup apparatus that includes a processing circuit that processes a signal supplied from the photoelectric conversion device.

14. A photoelectric conversion device including unit cells arranged in a well, each of the unit cells including a plurality of photoelectric conversion elements, an amplifier transistor, and a plurality of transfer transistors, each of the plurality of transfer transistors transferring electric charge of a corresponding one of the plurality of photoelectric conversion elements to a gate electrode of the amplifier transistor, and a reset transistor that resets a potential of the gate electrode of the amplifier transistor, the photoelectric conversion device comprising:
a well-voltage-supply line used to supply a voltage to the well;
a well-contact part that connects the well-voltage-supply line and the well, wherein, in a region of the unit cell, the well-contact part is disposed between one photoelectric conversion element among the plurality of photoelectric conversion elements and a photoelectric conversion element adjacent to the one photoelectric conversion element, among the plurality of photoelectric conversion elements;
plural transfer-control lines used to control the plurality of transfer transistors; and
a reset-signal line used to control the reset transistor,
wherein the well-voltage-supply line, the plural transfer-control lines, and the reset-signal line are arranged to be parallel to one another,
wherein a transfer-control line and the reset-signal line are symmetrically arranged with respect to a photoelectric conversion element, or a transfer-control line and the well-voltage-supply line are symmetrically arranged with respect to a photoelectric conversion element, and
wherein, in a region of each unit cell, the amplifier transistor is arranged in such a manner that a virtual line extends through the gate electrode of the amplifier transistor, the virtual line being parallel to the well-voltage-supply line and the plural transfer-control lines and extending through the well-contact part.

15. The photoelectric conversion device according to claim 14, wherein mirror symmetry is achieved by a part including one of the plurality of photoelectric conversion elements and one of the plurality of transfer transistors, the one of the plurality of transfer transistors being connected to the one of the plurality of photoelectric conversion elements, and a part including another one of the plurality of photoelectric conversion elements and another one of the plurality of transfer transistors, the other one of the plurality of transfer transistors being connected to the other one of the plurality of photoelectric conversion elements.

* * * * *